(12) United States Patent
McGrath et al.

(10) Patent No.: US 6,421,697 B1
(45) Date of Patent: Jul. 16, 2002

(54) VARIANTS ON LOW-LATENCY CONVOLUTION-SMOOTH UPDATING OF FILTER RESPONSE USING CROSSFADES

(75) Inventors: David Stanley McGrath, Bondi; Andrew Peter Reilly, Hurlstone Park, both of (AU)

(73) Assignee: Lake DSP Pty Ltd., New South Wales (AU)

( * ) Notice: Subject to any disclaimer, the term of this patent is extended or adjusted under 35 U.S.C. 154(b) by 0 days.

(21) Appl. No.: 09/281,769

(22) Filed: Mar. 30, 1999

(30) Foreign Application Priority Data

Mar. 31, 1998 (AU) ............................................... PP2711

(51) Int. Cl.⁷ ............................................... G06F 17/15
(52) U.S. Cl. ...................................................... 708/420
(58) Field of Search ................................ 708/309, 315, 708/400, 403, 404, 405, 420, 421

(56) References Cited

U.S. PATENT DOCUMENTS 5,270,953 A * 12/1993 White ........................ 708/321
5,606,575 A * 2/1997 Williams ..................... 375/219

* cited by examiner

Primary Examiner—Ohuong Dinh Ngo
(74) Attorney, Agent, or Firm—Fulwider Patton Lee & Utecht, LLP

(57) ABSTRACT

A method of performing a convolution of an input data stream, the method comprising the steps of: (a) transforming an initial series of input data values into the frequency domain to form initial frequency domain data values; (b) multiplying the frequency domain data values with a set of coefficients so as to form convolved frequency data; (c) transforming the convolved frequency data into a spatial domain so as to form an initial series of output data values; (d) performing steps (a) to (c) on a subsequent series of input data values of the input data stream so as to form a subsequent series of output data values; the subsequent series of input data values overlapping the initial series of input data values; and (e) cross fading overlapping portions of the initial and subsequent output data values.

15 Claims, 2 Drawing Sheets

TRADITIONAL "OVER-SAVE" METHOD

VARIANTS ON LOW-LATENCY CONVOLUTION-SMOOTH UPDATING OF FILTER RESPONSE USING CROSSFADES

FIELD OF THE INVENTION

The present invention relates to low latency convolution of digital signals and, in particular, describes a highly efficient form of convolution suitable for use on a processor architecture.

BACKGROUND OF THE INVENTION

The convolution of two signals is an extremely important process in many digital signal processing applications such as audio signal processing, radar signal analysis, video signal processing etc. The convolution process is commonly carried out in the Fourier Domain as it requires reduced computational resources.

Turning now to FIG. 1, there is illustrated the standard Fourier Domain "overlap and save" convolution process for convolving an audio signal. The process is more fully set out in the standard text such as "Digital Signal Processing", by John Proakis and Dimitis Manolakis, McMillan Publishing Company, 1992.

In the traditional overlap and save method as illustrated 20 in FIG. 1, the input signal 21 is digitized and divided into N sample blocks 22 with N normally being a power of 2. Similarly, an impulse response of length N 23 is determined normally by taking desired environmental measurements, and padded to length 2N by zeros. A first mapping 24 is applied to the 2N blocks of the impulse response 23 so as to form N complex numbers having real and imaginary coefficients. The FFT is then applied to produce N Frequency coefficients. The step 24 can be carried out once before processing begins and the corresponding frequency domain coefficients 25 stored for later use.

Next, blocks of length 2N of the input audio are taken and again a fast fourier transform is applied so as to determine corresponding frequency domain data 28 corresponding to the 2N real input values. Next, the two sets of data are element-by-element multiplied 30 so as to product frequency domain data 31. An inverse fourier transform is then applied to produce 2N real values with the first N 34 being discarded and the second N 35 becoming the output values 36 for the output audio. The process illustrated in FIG. 1 is well known as a standard frequency domain convolution process.

International PCT Application No. PCT/AU93/00330 entitled "Digital Filter Having High Accuracy and Efficiency", assigned to Lake DSP Pty Ltd, discloses a convolution filter which extends the aforementioned process so as to provide for an extremely low latency and the ability to perform long convolutions.

Unfortunately, it is often the case, particularly in head-tracked audio signal processing applications, that the impulse response coefficients 23 must be rapidly altered whilst an audio input signal is being convolved. Unfortunately, when such alterations are carried out, the output audio signal 36 often contains distracting audible 'clicks' which are highly undesirable.

SUMMARY OF THE INVENTION

It is an object of the present invention to provide for a convolution process suitable for utilization in producing cross fades.

In accordance with a first aspect of the present invention, there is provided a method of performing a convolution on an input data stream, the method comprising the steps of: (a) transforming an initial series of input data values into the frequency domain to form initial frequency domain data values; (b) multiplying the frequency domain data values with a set of coefficients so as to form convolved frequency data; (c) transforming the convolved frequency data into a spatial domain so as to form an initial series of output data values; (d) performing steps (a) to (c) on a subsequent series of input data values of the input data stream so as to form a subsequent series of output data values; the subsequent series of input data values overlapping the initial series of input data values; and (e) cross fading overlapping portions of the initial and subsequent output data values.

The initial series of input data values and the subsequent series of input data values data are preferably convolved with different sets of coefficients. The sets of coefficients, in one embodiment, represent impulse response functions.

The cross fading can comprise utilizing a fade up interpolation at an initial end of the output data values and a fade down at a final end of the output data values.

BRIEF DESCRIPTION OF THE DRAWINGS

Notwithstanding any other forms which may fall within the scope of the present invention, preferred forms of the invention will now be described, by way of example only, with reference to the accompanying drawings in which.

DESCRIPTION OF THE PREFERRED AND OTHER EMBODIMENTS

The preferred embodiment provides for a modified form of convolution that, through the utilization of cross-fades, provides for an enhanced convolution output in the presence of a changing impulse function.

Figure 1:
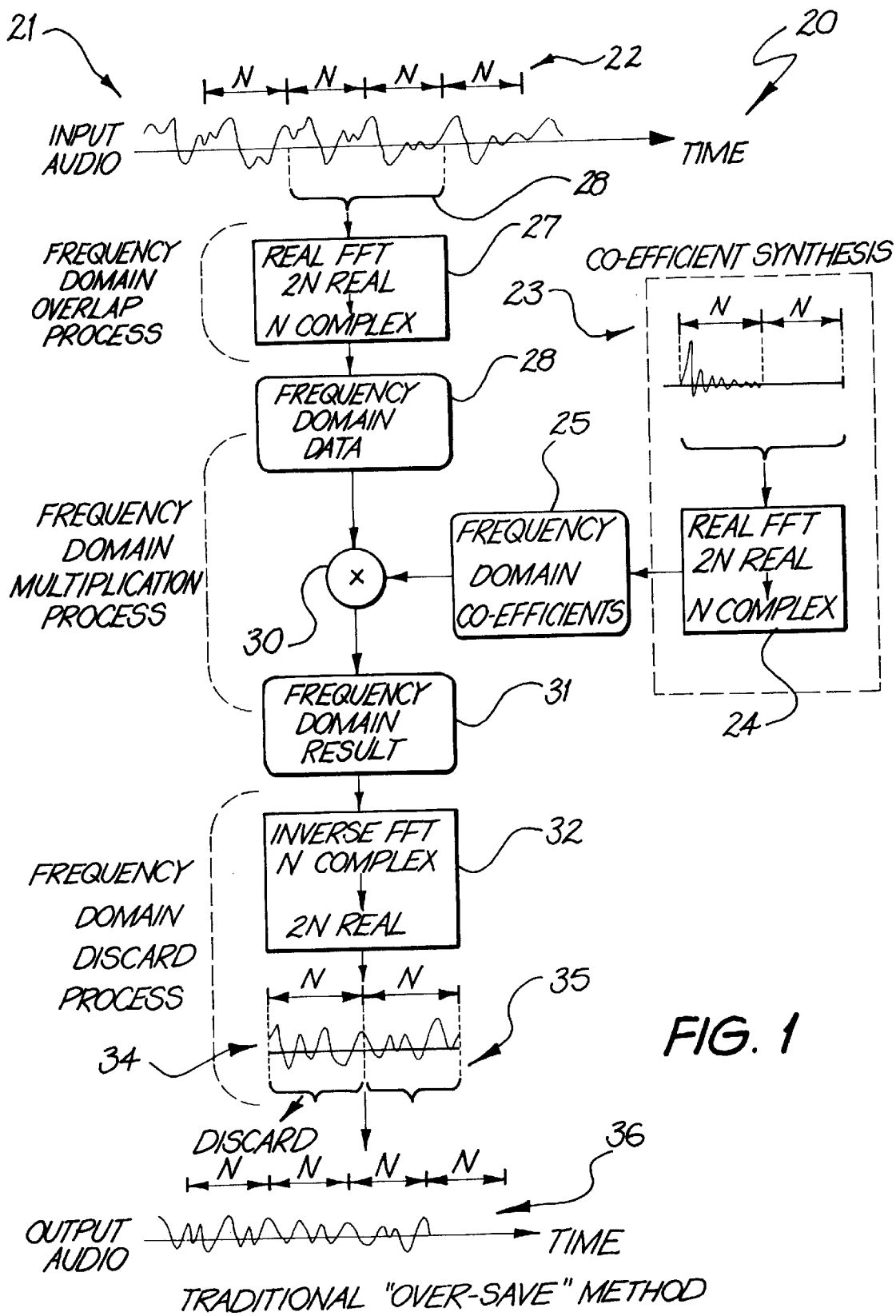
FIG. 1 illustrates and traditional overlap and save convolution process.
Figure 2:
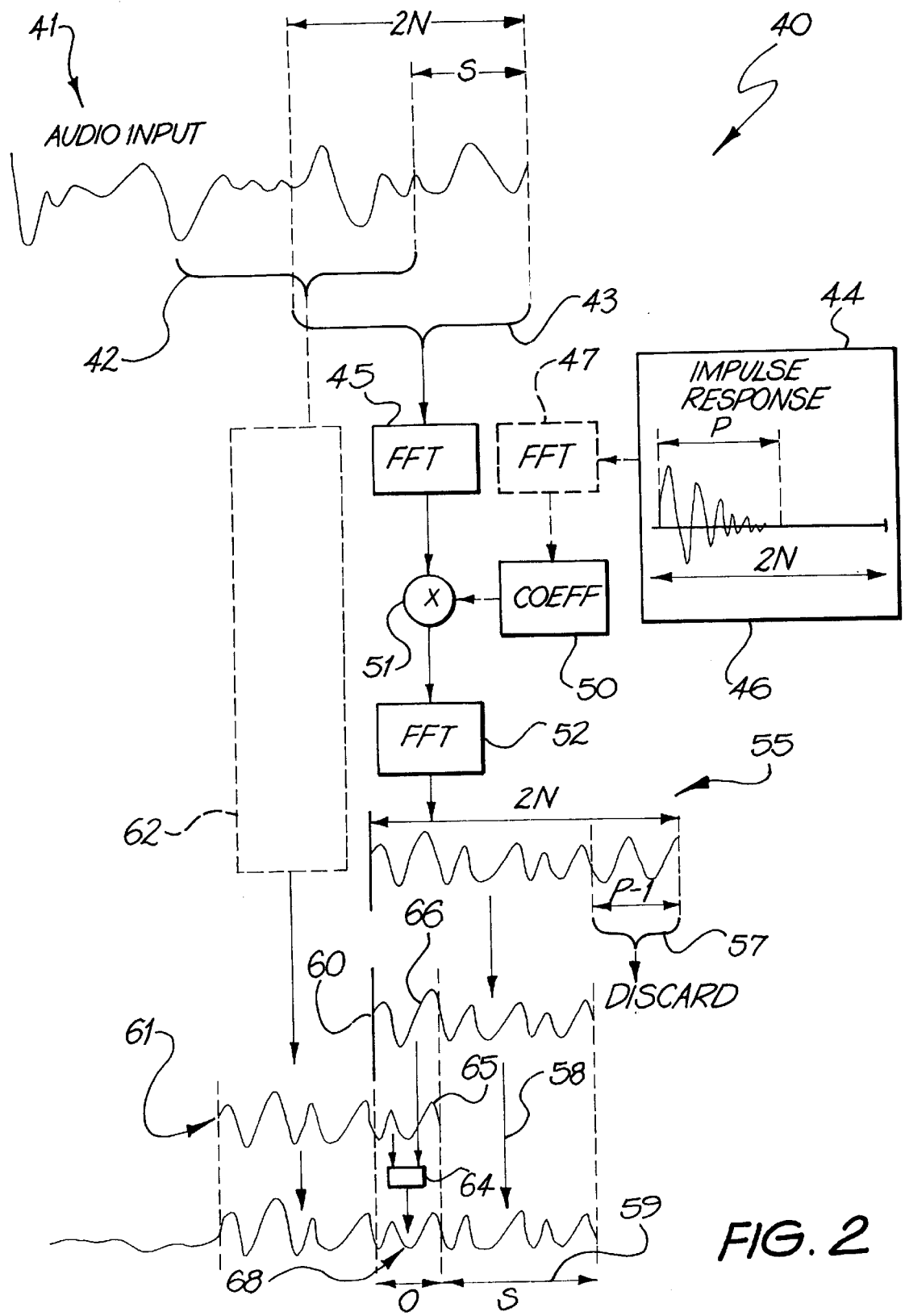
FIG. 2 illustrates the convolution—cross-fade process of the preferred embodiment.

The steps in the modified convolution process are as illustrated 40 in FIG. 2. In this embodiment, the audio input signal train is divided into overlapping blocks 42, 43 of length 2N. The overlapping factor is 2N–S. In a particular embodiment N was made equal to 128 and S was made equal to 112.

Overlapping blocks of length 2N are progressively input to a standard FFT block 45 which carries out a normal fast fourier transform.

An impulse response function 46 is formed having an initial response of length P, which in one embodiment was made equal to 112. An FFT 47 was carried out on the impulse response (it would be understood by those skilled in the art that this could be conducted off line) and the coefficients 50 multiplied 51 with the output of FFT 45. An inverse FFT 52 was then applied to the output and a time domain output 55 produced.

With the time domain output 55, the last P-1 signals 57 are discarded. A middle group of S values are forwarded 58 to form an output portion 59. With an initial O set of values (with, in one embodiment, O being equal to 32), an interpolation process is carried out between the output samples 60 and the previous group of output samples 61 output from the previous iteration 60.

If the filter coefficients are different from one frame to the next (as they will be when some controlling process determines that it is time to switch between the resident sets of impulse response coefficients 50), then these O values will be different from frame to frame too.

A smooth cross-fade (interpolation) 64 can be accomplished by multiplying each of the 0 old overlap values 65 by a reducing fade window, such as $$W(n)=0.5+0.5*\cos(\pi(n+1)/(O+1)), n \in [0, O-1]$$

and multiplying each of the 0 values 66 at the beginning of the new block by 1−W(n), and adding the two blocks of 0 resulting values together into the output buffer 68.

Through the utilisation of the process of the preferred embodiment, smooth switching between multiple impulse response can be produced and unwanted artifacts in output audio signals eliminated.

It would be appreciated by a person skilled in the art that numerous variations and/or modifications may be made to the present invention as shown in the specific embodiments without departing from the spirit or scope of the invention as broadly described. The present embodiments are, therefore, to be considered in all respects to be illustrative and not restrictive.

For example, the description of the preferred embodiment can obviously be readily extended to other environments where smooth crossfades are desired.

We claim:

1. A method of performing a smoothed time-varying convolution on an input signal train comprising the steps of:
   (a) dividing the input signal train into a series of overlapping blocks, each block including a set of input data values;
   (b) transforming the set of input data values in a first block of said series of overlapping blocks into the frequency domain to form an initial set of frequency domain data values;
   (c) multiplying said initial set of frequency domain data values with a set of coefficients so as to form an initial set of convolved frequency data values;
   (d) transforming said initial set of output data values;
   (e) performing steps (b) to (d) on the set of input data values in a second clock of said series of overlapping blocks so as to form a subsequent set of output data values, said subsequent set of output data values overlapping said initial set of output data values; and
   (f) cross fading overlapping portions of said initial and subsequent sets of output data values so as to create a convolved output signal having a smoothed transition between initial and subsequent sets of output data values with reduced unwanted artifacts therein.

2. A method as claimed in claim 1 wherein said cross fading comprises utilizing a fade up interpolation at an initial end of said output data values and a fade down interpolation at a final end of said output data values.

3. A method according to claim 2 in which said fade down interpolation is implemented by multiplying the final overlapping end of an initial set of each of the output data values by fade down function W(n)=0.5+0.5* cos (π(n+1)/(O+1)), n ∈[0, O−1], where O represents the degree of output overlap, and said fade up interpolation is implemented by multiplying the initial overlapping end of a subsequent set of each of the output data values by fade up function 1−W(n), with the two blocks of resulting overlapping cross faded output data values subsequently being added together.

4. A method according to claim 1 in which steps (e) and (f) are repeated in respect of subsequent adjacent overlapping blocks so as to create a convolved output signal having smoothed transitions between adjacent sets of output data values.

5. A method according to claim 4 in which the set of coefficients is time-varying, with the result that at least one set of frequency domain data values is multiplied with a set of coefficients which differs from those of an adjacent set of frequency domain data values.

6. A method according to claim 5 in which each block of input data values is of a predetermined length 2N, and there is a predetermined degree of overlap 2N-S between adjacent blocks.

7. A method as claimed in claim 1 wherein said sets of coefficients represent impulse response functions.

8. A method according to claim 7 in which the impulse response function has an initial response of length P, and is zero padded to length 2N.

9. A method as claimed in claim 1 wherein said cross fading comprises utilizing a fade up interpolation at an initial end of said output data values and a fade down interpolation at a final end of said output data values.

10. A method according to claim 1 in which the signals being processed are audio signals.

11. A method according to claim 10 in which steps (e) and (f) are arranged to reduce the unwanted artifacts in the form of audible "clocks" in the convolved output audio signal.

12. A method according to claim 11 which is utilized in a head tracked audio signal processing application.

13. A method according to claim 1 in which the signals being processed are radar signals or video signals.

14. A method of performing a smoothed time-varying convolution on an input signal train comprising the steps of:
    (a) dividing the input signal train into a series of overlapping blocks, each block including a set of input data values;
    (b) transforming the set of input data values in an nth block of said series of overlapping blocks into the frequency domain to form an initial set of frequency domain data values;
    (c) multiplying said initial set of frequency domain data values with a first et of coefficients so as to form an initial set of convolved frequency data values;
    (d) transforming said initial set of convolved frequency data values into the time domain so as to form an initial set of output data values;
    (e) repeating step (b) on the set of input data values in an (n+1)th block of said series of overlapping blocks;
    (f) multiplying said initial set of frequency domain data values with a second set of coefficients which is different from the first set of coefficients so as to form a subsequent set of convolved frequency data values;
    (g) transforming said subsequent set of convolved frequency data values into the time domain so as to form a subsequent set of output data values overlapping said initial set of output data values, and
    (h) cross fading overlapping portions of said initial and subsequent sets of output data values so as to create a convolved output signal having a smoothed transition between initial and subsequent sets of output data values with reduced unwanted artifacts therein.

15. A method according to claim 14 in which steps (a) to (h) are repeated in respect of subsequent overlapping blocks having different sets of coefficients.

* * * * *

UNITED STATES PATENT AND TRADEMARK OFFICE
CERTIFICATE OF CORRECTION

PATENT NO. : 6,421,697 B1
DATED : July 16, 2002
INVENTOR(S) : David Stanley McGrath and Andrew Peter Reilly It is certified that error appears in the above-identified patent and that said Letters Patent is hereby corrected as shown below:

Column 3,
Line 38, replace "clock" with -- block --.

Column 4,
Line 24, replace "clocks" with -- clicks --.

Signed and Sealed this

Thirty-first Day of December, 2002

JAMES E. ROGAN
*Director of the United States Patent and Trademark Office*